United States Patent [19]

Masini et al.

[11] Patent Number: 5,818,209

[45] Date of Patent: Oct. 6, 1998

[54] BOOTSTRAP LINE POWER SUPPLY REGULATOR WITH NO FILTER CAPACITOR

[75] Inventors: Marco Masini, Milano; Sandro Storti, Giovanni; Stefania Boiocchi, Certosa, all of Italy

[73] Assignee: SGS-Thomson Microelectronics S.r.l., Agrate Brianza, Italy

[21] Appl. No.: 672,234

[22] Filed: Jun. 27, 1996

[30] Foreign Application Priority Data

Jun. 30, 1995 [EP] European Pat. Off. ............. 95830283

[51] Int. Cl.⁶ .................................................. G05F 1/44
[52] U.S. Cl. ......................... 323/289; 323/224; 327/377
[58] Field of Search .................................. 323/224, 225, 323/284, 285, 289; 327/374–377

[56] References Cited

U.S. PATENT DOCUMENTS

| | | | |
|---|---|---|---|
| 3,714,466 | 1/1973 | Spence | 307/237 |
| 4,922,249 | 5/1990 | Cointot et al. | 307/263 |
| 4,989,127 | 1/1991 | Wegener | 363/98 |
| 5,111,084 | 5/1992 | Suko | 307/571 |
| 5,138,200 | 8/1992 | Barsanti et al. | 307/482 |
| 5,373,435 | 12/1994 | Jayaraman et al. | 363/98 |
| 5,627,460 | 5/1997 | Bazinet et al. | 323/284 |

FOREIGN PATENT DOCUMENTS

| | | | |
|---|---|---|---|
| A-0 103 645 | 3/1984 | European Pat. Off. | H03K 5/01 |
| A-0 367 006 | 5/1990 | European Pat. Off. | H03K 17/06 |
| A-34 05 936 | 8/1985 | Germany | H02M 1/08 |
| WO-A-94 27370 | 11/1994 | WIPO | H03K 17/04 |

OTHER PUBLICATIONS

European Search Report from European Patent Application No. 95830283.8 filed Jun. 30, 1995.

*Primary Examiner*—Peter S. Wong
*Assistant Examiner*—Derek J. Jardieu
*Attorney, Agent, or Firm*—Wolf, Greenfield & Sacks, P.C.

[57] ABSTRACT

A power supply regulator comprising a regulated-voltage source; a buffer connected to the voltage source; and a diode connected to the output of the buffer. A bootstrap capacitor is located between the diode and the output of a power stage; and the output of the power stage is switched between a low and a high value by a digital signal also supplied to the input of the buffer which therefore generates a switched regulated output voltage varying between a first value equal to the regulated voltage and a second lower value. The switched regulated voltage switches from the first to the second value before the output of the power stage switches to high, thus immediately disabling the diode and preventing current spikes due to minority carriers in the diode from being transmitted to the regulated-voltage source. The switched regulated voltage switches from the second to the first value before the output of the power stage switches to low, to permit charging of the bootstrap capacitor to the regulated voltage when the output is low.

42 Claims, 4 Drawing Sheets

BOOTSTRAP LINE POWER SUPPLY REGULATOR WITH NO FILTER CAPACITOR

BACKGROUND OF THE INVENTION

1. Field of the Invention

The present invention relates to a bootstrap line power supply regulator with no filter capacitor. In particular, the present invention relates to a power supply regulator for a switching-type power stage of the type featuring power MOS transistors and a bootstrap capacitor for biasing the top power transistor at a level higher than the supply voltage.

2. Discussion of the Related Art

As is known, a power stage of the above type is supplied with a low-power square-wave signal, supplies a square-wave power output voltage, and typically includes the structure shown in FIG. 1 which is described below to give a clear idea of one of the problems solved by the present invention.

Figure 1:
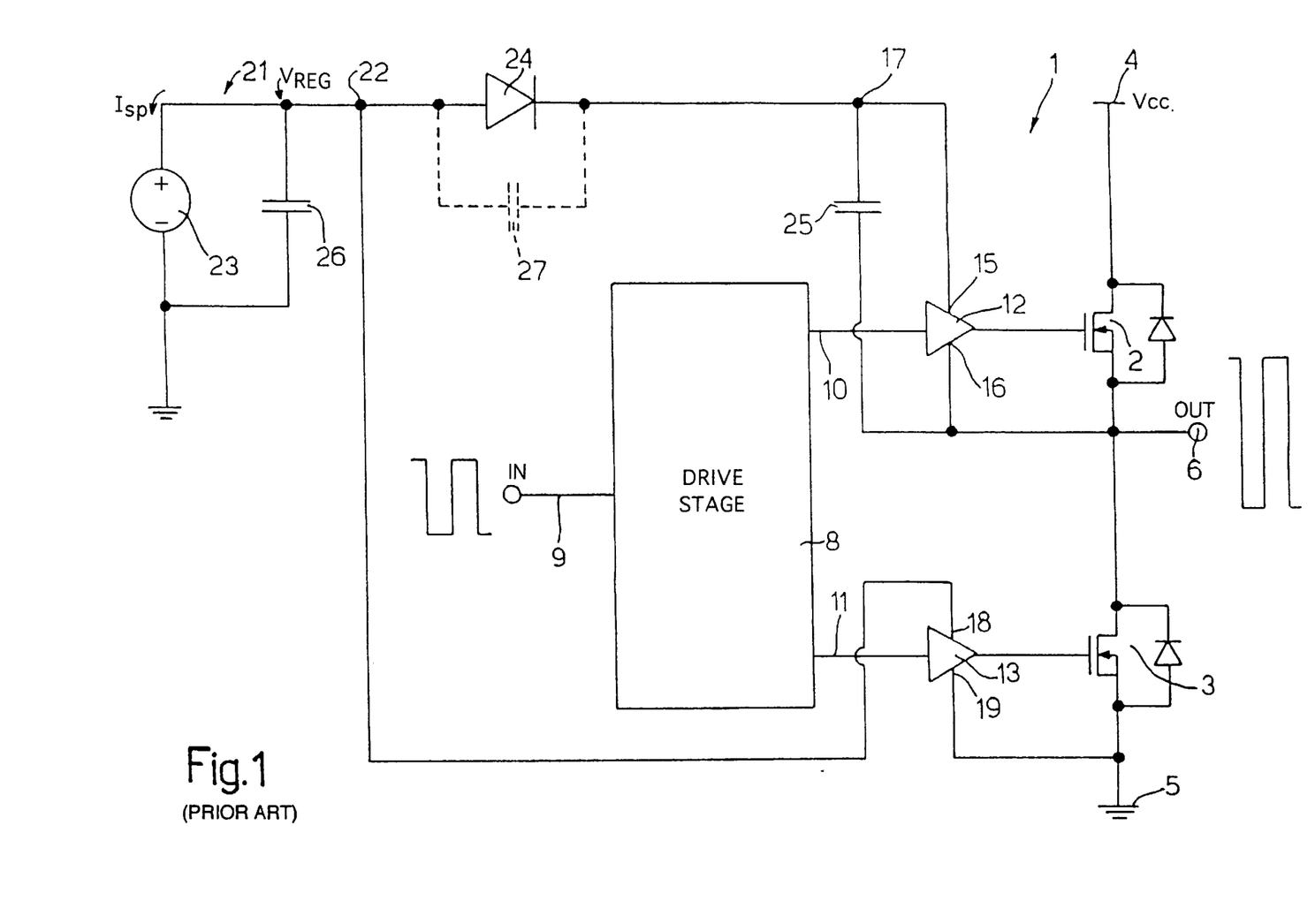
FIG. 1 shows a diagram of a switching-type power stage comprising a bootstrap capacitor and a known power supply regulator.

The FIG. 1 power stage, indicated as a whole by 1, comprises a pair of N-channel power MOS transistors 2, 3 connected between a supply line 4 and a ground line (reference potential line) 5. Transistor 2 (constituting the high-side power transistor) has the drain terminal connected to supply line 4 at potential $V_{cc}$, and the source terminal connected to an output node 6; and transistor 3 (constituting the low-side power transistor) has the drain terminal connected to output node 6, and the source terminal connected to ground line 5. Power stage 1 is controlled by a drive stage 8 having an input 9 supplied with a low-power square-wave input signal IN, and a pair of outputs 10, 11 connected by respective buffer amplifiers 12, 13 to the gate terminals of transistors 2, 3 respectively. Drive stage 8 is a known type, and, according to one embodiment, for example, comprises an N-channel MOS transistor with the gate terminal supplied with signal IN, the source terminal grounded, and the drain terminal connected to a supply line via a resistor. The drain terminal of the transistor forms output 10, and output 11 is connected directly to input 9.

Buffer amplifier 12 has a first and second bias input 15, 16 connected respectively to nodes 17 and 6; and buffer amplifier 13 has a first and second bias input 18, 19 connected respectively to a regulated-voltage input node 22 and to ground line 5.

Power stage 1 is supplied by a regulated-voltage power supply 21 comprising a voltage source 23 generating a regulated voltage $V_{REG}$ and connected between regulated-voltage node 22 and ground, and a diode 24 with its anode terminal connected to node 22 and its cathode terminal connected to node 17. FIG. 1 also shows a bootstrap capacitor 25 connected between nodes 17 and 6, for charging high-side power transistor 2.

FIG. 1 also shows a filter capacitor 26 connected parallel with voltage source 23; a parasitic capacitor 27 associated and connected parallel with diode 24; and the protection diodes (not numbered in detail) associated in known manner with the power MOS transistors.

Ignoring filter capacitor 26 and parasitic capacitor 27 for the time being, the FIG. 1 circuit operates as follows. On the basis of input signal IN at input 9, drive stage 8 generates, at outputs 10, 11, two complementary square-wave signals for driving buffer amplifiers 12, 13, which in turn generate gate voltages related to the voltages at their terminals 16, 19, and such as to alternatively turn on transistors 2, 3, and ensure the necessary source-gate voltage drop for achieving a good saturation level of transistors 2, 3.

More specifically—assuming that, when signal IN is high, output 10 of the drive stage is high and output 11 is low, and vice versa—when IN is low, output 11 is at a high voltage; the output of buffer amplifier 13 is high (roughly 10–15 V with respect to ground); transistor 3 is saturated and grounds output node 6 (OUT output low); conversely, the output of buffer amplifier 12 is low; transistor 2 is off; node 22 is at a higher potential than node 6; and diode 24 is biased directly to charge bootstrap capacitor 25 to regulated voltage $V_{REG}$ (less the voltage drop across diode 24).

When signal IN switches to high, output 11 of drive stage 8 switches to a low voltage; the output of buffer amplifier 13 is at ground potential so that transistor 3 is turned off; conversely, output 10 switches to high and turns on transistor 2, so that output node 6 increases in voltage; as soon as the OUT voltage at node 6 increases, the voltage at node 17 also increases by virtue of bootstrap capacitor 25, and diode 24 becomes off. In other words, an increase in the voltage at output node 6 is accompanied by a corresponding increase in the voltage at node 17, so that the output voltage supplied by buffer amplifier 12 and related to node 6, i.e. to the source terminal of transistor 2, is such as to fully saturate transistor 2 and so bring node 6 to a high voltage (OUT output equal to $V_{cc}$).

In practice, as the output signal OUT switches from low (ground) to high ($V_{cc}$), bootstrap capacitor 25, via buffer amplifier 12, supplies the gate terminal of high-side transistor 2 with the necessary charge, and recharges itself when the OUT output is low. In the first step, current flows from regulated-voltage source 23 through diode 24 to bootstrap capacitor 25; in the second step, current flows from bootstrap capacitor 25 to node 17, input 15 of buffer amplifier 12, the gate terminal of transistor 2, node 6, and back to bootstrap capacitor 25, and diode 24 is inversely biased with no current flowing through it.

In the event the output voltage OUT switches to high before bootstrap capacitor 25 is fully charged, the FIG. 1 circuit encounters problems in that, in this case, diode 24 is still supplied with the charge current I of capacitor 25, and has therefore accumulated a minority charge $Q = I\tau$ wherein $\tau$ is the transit time of the minority carriers. Thus, account must now be taken of the parasitic capacitor indicated by 27 in FIG. 1, and presenting a diffusion capacitance $Cd = Q/V_t$ wherein $V_t$ is the thermal voltage. This therefore results in a capacitive network comprising bootstrap capacitor 25 and parasitic capacitor (diffusion capacitance) 27, and which tends to transmit the transition at the output to source $V_{REG}$ and so generate a current spike $I_{sp}$ in voltage source 23.

To roughly calculate the value of current $I_{sp}$, diode 24 must lose the minority charge Q in time $\Delta t$, wherein $\Delta t$ is the fraction of the transition time of output voltage OUT required to switch diode 24 from a direct to an inverse bias, so that $I_{sp} = Q/\Delta t$.

For output voltage OUT switching times of about 100 ns, fraction $\Delta t$ may be around 10 ns or less; and, if, for example, I=200 mA and $\tau$=20 ns, current spike $I_{sp}$ entering source 23 is around 400 mA or even more.

Given the inductive nature of the output impedance of a power supply regulator, the current spike causes an unacceptable, uncontrolled increase in the regulated voltage at node 22.

To solve the problem, it has been proposed to use a filter capacitor—indicated by 26 in FIG. 1—connected parallel with regulated-voltage source 23, and which presents a capacitance of about one nanofarad, and absorbs the current spike with no appreciable increase in voltage at its terminals (and hence at node 22).

3

The disadvantage of this solution lies in the above capacitance preventing integration of filter capacitor 26 which thus represents an additional external component.

SUMMARY OF THE INVENTION

It is an object of the present invention to provide a power supply regulator of the above type, designed to operate correctly in any situation, even in the absence of a filter capacitor.

One embodiment of the invention is directed to a bootstrap line power supply regulator having a regulated-voltage node that receives a regulated voltage. The bootstrap line power supply includes a regulated voltage source having a regulated-voltage node, a bootstrap line, a unipolar switch interposed between the regulated voltage node and the bootstrap line, and generating means for generating a signal for turning off the unipolar switch before a reference voltage at a reference node switches from a first to a second value, and for generating a turn on signal when the reference voltage switches from a second to a first value.

Another embodiment of the present invention is directed towards an isolation circuit in a power supply regulator having a first input for coupling to a voltage supply to receive an input voltage, a second input to receive a control signal having a control value and an output to provide an output voltage having one of a first or a second value in response to the control value of the control signal. The isolation circuit includes a first input, a second input, and a switching circuit coupled to the first and second inputs of the isolation circuit, that electrically isolates the input of the power supply from transient signals generated by the power supply regulator.

Another embodiment of the present invention is directed towards a method of operating a power supply regulator, wherein the power supply regulator has an input for receiving an input voltage and an output that provides an output voltage having one of a first and a second voltage value. The method includes a step of isolating the input of the power supply regulator from transients generated by the power supply regulator when the output voltage switches from the first value to the second value.

Another embodiment of the invention is directed to a power supply having an input to receive a control signal having a value, and an output to provide an output voltage having one of a first or a second voltage value in response to the value of the control signal. The power supply includes a voltage source having an output that provides a reference voltage, a regulator circuit having a first input, a second input, an output coupled to the output of the power supply, and a switching circuit that electrically isolates the voltage source from transients generated by the regulator circuit.

Another embodiment of the invention is directed to an isolation circuit in a power supply regulator. The isolation circuit includes isolation means for electrically isolating an input of the power supply regulator from transients generated by the power supply regulator.

BRIEF DESCRIPTION OF THE DRAWINGS

A preferred, non-limiting embodiment of the present invention will be described by way of example with reference to the accompanying drawings, in which.

DETAILED DESCRIPTION

Figure 2:
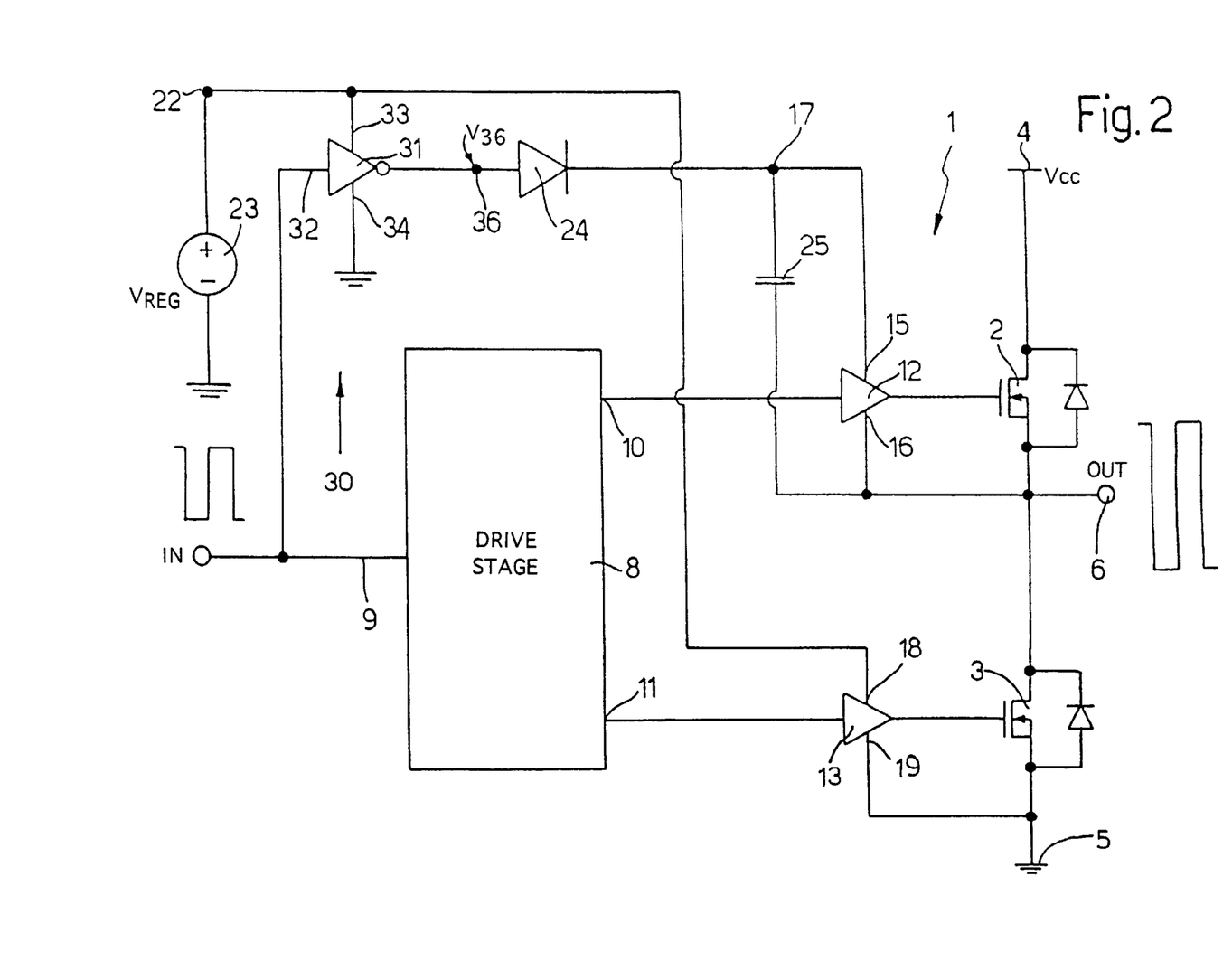
FIG. 2 shows an overall diagram of the power supply regulator according to the present invention, and as applied to the FIG. 1 power stage.

In FIG. 2, the power supply regulator is indicated by 30, and is applied to a power stage 1 of the type shown in and described in detail with reference to FIG. 1. The FIG. 2 components similar to those in FIG. 1 are therefore indicated using the same reference numbers with no further description.

In addition to regulated-voltage source 23, the FIG. 2 power supply regulator 30 also comprises an inverting buffer amplifier 31 in turn comprising a signal input 32 connected to input 9 of drive stage 8 to receive the same IN signal, and two bias inputs 33, 34, of which input 33 is connected to node 22 set at regulated voltage $V_{REG}$, and input 34 is grounded. The output of inverting buffer amplifier 31 defines a node 36 (set at a switched regulated voltage $V_{36}$) connected to the anode of diode 24, the cathode of which is connected, as in FIG. 1, to node 17 to charge bootstrap capacitor 25.

Operation of the circuit according to the present invention is based on the fact that, as regards the downstream power stage 1, the value of regulated voltage $V_{REG}$ is only of importance when output 6 of the power stage is low, i.e. when bootstrap capacitor 25 is being charged, whereas, when output 6 is high, the regulated voltage value is no longer of any importance by virtue of buffer amplifier 12 being supplied by bootstrap capacitor 25; and on the fact that, to prevent current spikes from being transmitted to regulated-voltage source 23, diode 24 need simply be turned off before output 6 of power stage 1 switches to high.

The FIG. 2 circuit therefore operates as follows. When the input signal is low (0 V), output 11 of drive stage 8 and the output of buffer amplifier 13 are high, so that transistor 3 is turned on; conversely, the output of buffer amplifier 12 is low, and transistor 2 is turned off, as already described with reference to FIG. 1. As such, the output of inverting buffer 31 is high and equal to the regulated voltage $V_{REG}$ at node 22, thus permitting capacitor 25 to be charged to regulated voltage $V_{REG}$ as in the FIG. 1 circuit.

When input signal IN switches to high (e.g. 12 V), the output of inverting buffer 31 switches rapidly to ground potential (0 V) and inversely biases diode 24 which is turned off. Following a delay due to switching of drive stage 8, outputs 10, 11 of the drive stage and hence the outputs of buffer amplifiers 12, 13 also switch as described with reference to FIG. 1, so that transistor 3 is turned off, and transistor 2 is turned on to connect output terminal 6 to supply voltage $V_{cc}$ when diode 24 is already definitely turned off. Consequently, when output 6 switches, current is prevented from flowing through diode 24 to regulated-voltage source 23, even in the event capacitor 25 is not fully charged.

When input signal IN again switches to low, the regulated voltage at the anode of diode 24 is restored before the OUT output switches to low, thus ensuring bootstrap capacitor 25 is charged.

Figure 3:
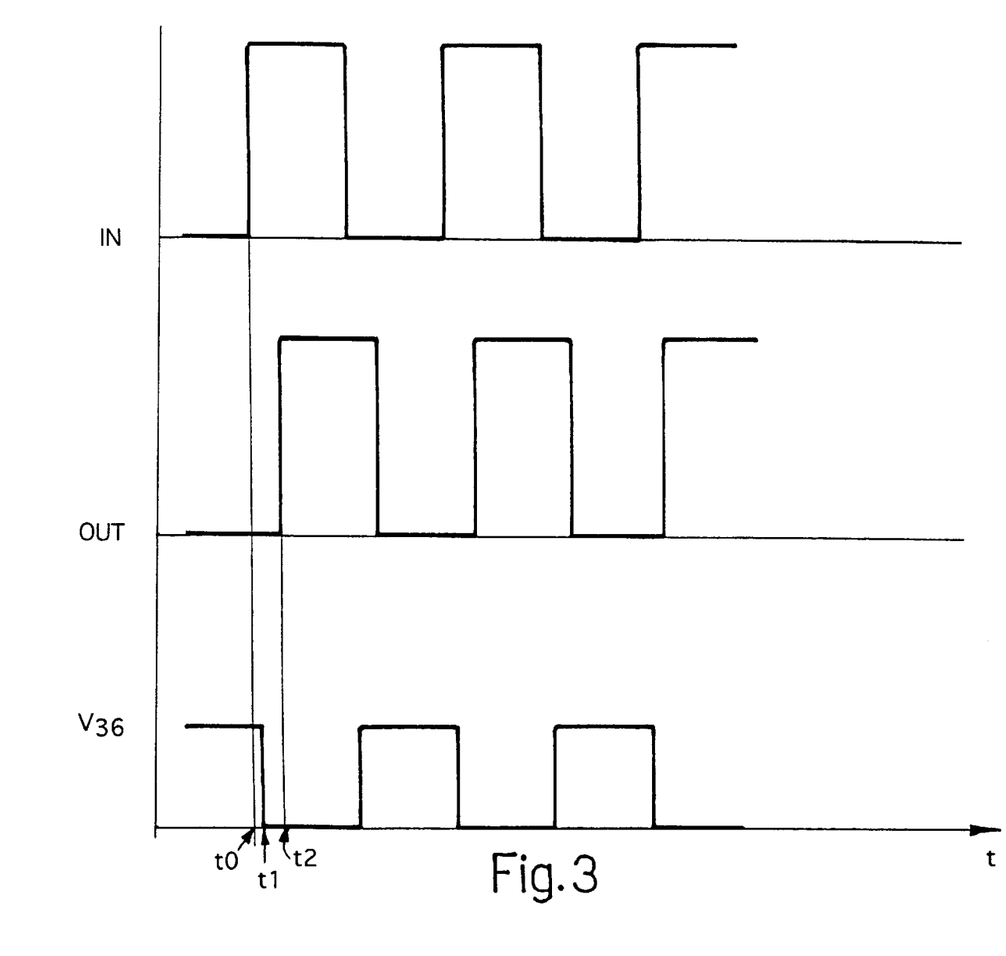
FIG. 3 shows plots of a number of voltages relative to the FIG. 2 diagram.

The time relationship between the switching of input signal IN, output voltage OUT, and the switched regulated voltage $V_{36}$ at node 36 (anode of diode 24) is shown clearly in the time plots of the three quantities in FIG. 3. In particular, following low-to-high switching of input signal IN at instant $t_0$, the switched regulated voltage $V_{36}$ switches to low at instant $t_1$ (turning off inversely-biased diode 24), and output voltage OUT switches to high at instant $t_2>t_1$.

The time sequence shown (wherein switched regulated voltage $V_{36}$ switches in advance of output voltage OUT) is ensured by the propagation of the IN signal from input 9 to node 36 involving a small number of components (only inverting buffer 34), whereas propagation of the IN signal from input 9 to output 6 involves drive stage 8 (which in itself presents a propagation delay of other than zero), buffer amplifiers 12, 13, and power transistors 2, 3. Moreover, the circuit may be so designed as to ensure that, in any condition, the output always switches after switched regulated voltage $V_{36}$. For circuits of the type shown, the delay between input 9 and output 6 is typically of about 100 ns, and the delay between input 9 and node 36 may be guaranteed below 50 ns at all times.

Figure 4:
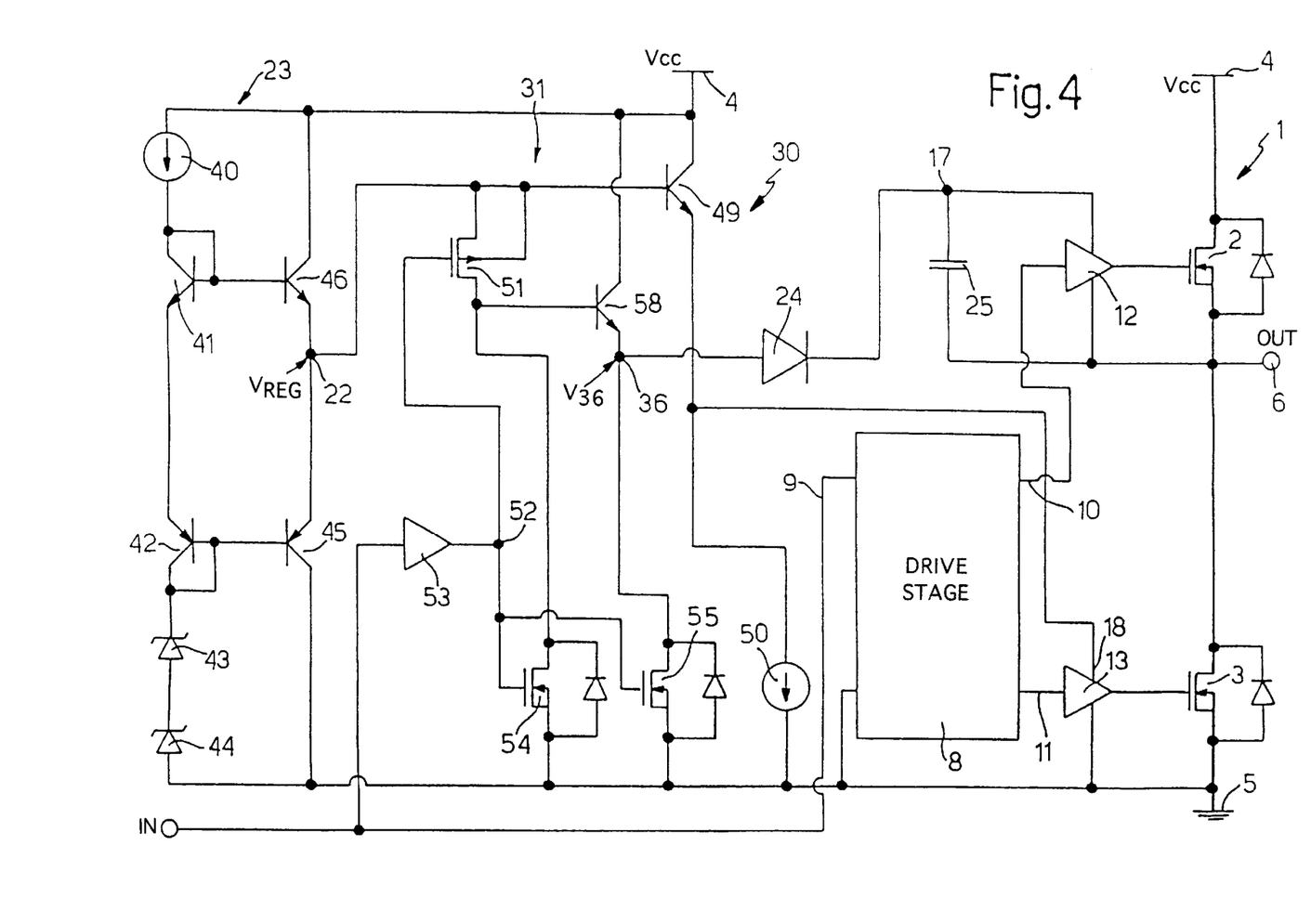
FIG. 4 shows a more detailed circuit diagram of a possible implementation of the FIG. 2 arrangement.

One embodiment of the FIG. 2 circuit is shown in FIG. 4, which shows regulated-voltage source 23 and inverting buffer amplifier 31 in more detail.

More specifically, regulated-voltage source 23 comprises a current source 40 connected between supply line 4 at $V_{cc}$ and the collector of a diode-connected NPN bipolar transistor 41 (with the collector and base short-circuited). The emitter of transistor 41 is connected to the emitter of a diode-connected PNP transistor 42, the collector of which is grounded via two Zener diodes 43, 44 in series with each other. The base terminal of transistor 42 is connected to the base terminal of a PNP transistor 45, the collector of which is grounded, and the emitter of which defines node 22 at regulated voltage $V_{REG}$. Node 22 is also connected to the emitter of an NPN transistor 46, the base terminal of which is connected to the base terminal of transistor 41, and the collector terminal of which is connected to supply line 4.

Node 22 is also connected to the base terminal of an NPN transistor 49, the collector terminal of which is connected to supply line 4, and the emitter terminal of which is connected to input 18 of buffer amplifier 13 and to a current source 50 interposed between transistor 49 and ground.

Node 22 is also connected to the drain terminal of a P-channel MOS transistor 51, the gate terminal of which is connected to a node 52 defined by the output of a buffer amplifier 53, the input of which is connected to input 9 of drive stage 8 and is supplied with signal IN. Node 52 is also connected to the gate terminal of two N-channel MOS transistors 54 and 55. More specifically, the source terminal of MOS transistor 54 is grounded, and the drain terminal is connected to the drain terminal of MOS transistor 51; and the source terminal of MOS transistor 55 is also grounded, and the drain terminal is connected to node 36 (anode of diode 24). Finally, node 36 is connected to the emitter of an NPN bipolar transistor 58, the base terminal of which is connected to node 52, and the collector terminal of which is connected to supply line 4.

FIG. 4 also shows power MOS transistors 2, 3, 54, 55 are shown together with respective protection diodes (not numbered).

In the FIG. 4 circuit, Zener diodes 43, 44 generate the regulated voltage which, added to voltage drop $V_{BE}$ at the base-emitter junction of transistor 41, is supplied to low-output-impedance node 22. Via transistor 49, the regulated voltage (corresponding to $V_{REG}$ in FIG. 2) is supplied to buffer amplifier 18; and the same regulated voltage (added to the base-emitter voltage drop $V_{BE}$ of transistor 58 and to the source-drain voltage drop of MOS transistor 51, which is nevertheless substantially negligible) is supplied to node 36 via the inverter formed by MOS transistors 51, 54, 55 when MOS transistor 51 is turned on, to generate the switched regulated voltage $V_{36}$ supplied to diode 24. More specifically, when input signal IN is low, the output of buffer amplifier 53 is also low, so that transistor 51 stays on and transistors 54, 55 stay off, the base terminal of transistor 58 is biased substantially at the regulated voltage at node 22, and supplies the regulated voltage (less voltage drop $V_{BE}$) to the anode of diode 24 to charge capacitor 25.

When input signal IN switches to high, the output of buffer amplifier 53 also switches to high, thus turning off MOS transistor 51 and turning on MOS transistors 54, 55, which ground node 36, so that diode 24 is turned off as described with reference to FIG. 2.

In the FIG. 4 circuit also, the propagation delay of the switching edges of input signal IN through buffer amplifier 53 and transistors 51, 58, 54, 55 is less than that of the same edges through components 8, 12, 13, 2, 3, to ensure correct operation of the switched power supply regulator.

The advantages of the circuit described are as follows. Firstly, it provides for preventing uncontrolled variations in the regulated voltage, without using filter capacitors of non-integratable value. Secondly, it involves only a small number of simple, easily-integratable additional components, and therefore practically no increase in manufacturing cost as compared with known circuits. And, thirdly, it is reliable and accurately controlled.

Clearly, changes may be made to the circuit as described and illustrated herein without, however, departing from the scope of the present invention. In particular, in addition to supplying power stages of the type described, the solution according to the present invention may also be applied to other circuits featuring a bootstrap capacitor so controlled as to be first charged, and then supply a load at a higher voltage than the charge voltage.

Having thus described at least one illustrative embodiment of the invention, various alternations, modifications, and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A bootstrap line power supply regulator comprising:
   a regulated voltage source having a regulated-voltage node;
   a bootstrap line having a supply node and a reference node, said reference node being at a reference voltage switchable between a first value and a second value, said first value being lower than said second value;
   a unipolar switch interposed between said regulated-voltage node and said supply node; and
   generating means for generating a turn-off signal for turning off said unipolar switch before each switching of said reference voltage from said first value to said second value, and for generating a turn-on signal for turning on said unipolar switch each time said reference voltage switches from said second to said first value.

2. The power supply regulator of claim 1, wherein:
   said bootstrap line includes a bootstrap capacitor interposed between said supply node and said reference node;
   said unipolar switch includes a diode having an anode coupled to said generating means and a cathode coupled to said supply node; and the power supply regulator further comprises a power stage having first and second power transistors, the first power transistor being coupled between a supply voltage line and said reference node and the second power transistor being coupled between a ground line and said reference node.

3. The power supply regulator of claim 1, further comprising a drive stage having an input supplied with a digital control signal, and an output coupled to said reference node, and wherein said generating means includes a buffer amplifier having an input coupled to said input of said drive stage, an output coupled to said unipolar switch, and at least one bias terminal coupled to said regulated-voltage node.

4. The power supply regulator of claim 1, wherein said generating means comprises supply switching means, interposed between said regulated-voltage node and said unipolar switch, for generating a switched regulated voltage that varies between a first level equal to said regulated voltage, and a second level lower than said first level.

5. The power supply regulator of claim 4, further comprising a drive stage having an input supplied with a digital control signal, and an output coupled to said reference node, and wherein said generating means includes a buffer amplifier having an input coupled to said input of said drive stage, an output coupled to said unipolar switch, and at least one bias terminal coupled to said regulated-voltage node.

6. The power supply regulator of claim 5, wherein said buffer amplifier includes an input buffer having an input coupled to the input of the drive stage and an output, and an inverter having an input coupled to the output of said input buffer and an output coupled to the unipolar switch.

7. The power supply regulator of claim 6, wherein:
    said bootstrap line includes a bootstrap capacitor interposed between said supply node and said reference node;
    said unipolar switch includes a diode having an anode coupled to said generating means and a cathode coupled to said supply node; and
    the power supply regulator further comprises a power stage having first and second power transistors, the first power transistor being coupled between a supply voltage line and said reference node and the second power transistor being coupled between a ground line and said reference node.

8. The power supply regulator of claim 1 wherein the generating means generates said turn-off signal and said turn-on signal in response to receipt of a control signal having a first value and a second value, respectively.

9. The power supply regulator of claim 8 wherein the first value of the control signal is higher than the second value of the control signal, and said reference voltage is switched to its second value in response to said control signal changing from its second value to its first value.

10. In a power supply regulator having a first input that receives an input voltage having an input voltage value, a second input that receives a control signal and an output that provides an output voltage having one of a first output voltage value and a second output voltage value in response to a value of the control signal, the second output voltage value being greater than the first output voltage value and the input voltage value, an isolation circuit comprising:
    a first input coupled to the first input of the power supply regulator to receive the input voltage;
    a second input coupled to the second input of the power supply regulator to receive the control signal; and
    a switching circuit, coupled to the first and second inputs of the isolation circuit, that electrically isolates the input of the power supply from transient signals generated by the power supply regulator when the output voltage switches from the first output voltage value to the second output voltage value.

11. The isolation circuit of claim 10, wherein the switching circuit is arranged to, in response to a change in the value of the control signal, switch from the first operational state to the second operational state before the output voltage at the output of the power supply regulator switches from the first voltage value to the second voltage value in response to the change in the value of the control signal.

12. The isolation circuit of claim 10, in combination with the power supply regulator.

13. The combination of claim 12, in combination with a voltage source having an output coupled to the first input of the power supply regulator to provide the input voltage.

14. The isolation circuit of claim 10, wherein the switching circuit further includes an output and is arranged to operate in one of a first and a second operational state in response to the value of the control signal, wherein in the first operational state, the output of the switching circuit is coupled to the first input of the isolation circuit so that the voltage at the output of the switching circuit substantially equals the voltage at the first input of the isolation circuit, and in the second operational state, the output of the switching circuit is substantially electrically isolated from the first input of the isolation circuit.

15. The isolation circuit of claim 14, wherein the switching circuit is arranged to, in response to a change in the value of the control signal, switch from the first operational state to the second operational state before the output voltage at the output of the power supply regulator switches from the first voltage value to the second voltage value in response to the change in the value of the control signal.

16. The isolation circuit of claim 15, wherein the switching circuit includes:
    a buffer amplifier having first and second inputs and an output, the first and second inputs of the buffer amplifier being respectively coupled to the first and second inputs of the isolation circuit; and
    an inverter having an input coupled to the output of the buffer amplifier and an output coupled to the output of the switching circuit.

17. The isolation circuit of claim 16, in combination with the power supply regulator.

18. The combination of claim 17, wherein the power supply regulator further includes:
    an electrical component having an input coupled to the output of the switching circuit and an output, the electrical component providing essentially a short circuit from the input of the electrical component to the output of the electrical component when a voltage at the input of the electrical component is greater than a voltage at the output of the electrical component by a predetermined amount, the electrical component providing essentially an open circuit between the output of the electrical component and the input of the electrical component when a voltage at the input of the electrical component is less than a voltage at the output of the electrical component; and
    a capacitor having a first terminal coupled to the output of the electrical component and a second terminal coupled to the output of the power supply regulator.

19. The combination of claim 18, wherein the electrical component is a diode.

20. The combination of claim 18, wherein the control value alternates between first and second voltage levels corresponding to first and second logic states, and wherein the power supply regulator further includes a drive stage having first and second outputs and an input coupled to the second input of the power supply regulator to receive the control signal, the drive stage being arranged to provide complementary output voltages at the first and second outputs of the drive stage.

21. The combination of claim 20, wherein the power supply regulator further includes:
   a third input to receive a first reference voltage; and
   first and second buffer amplifiers having inputs respectively coupled to the first and second outputs of the drive stage, and each having an output, the first buffer amplifier having first and second bias inputs respectively coupled to the first and second terminals of the capacitor, the second buffer amplifier having first and second bias inputs respectively coupled to the first and third inputs of the power supply regulator.

22. The combination of claim 21, wherein the power supply regulator further includes:
   a fourth input to receive a second reference voltage; and
   first and second transistors each having a control input coupled to the output of a respective one of the first and second buffer amplifiers, and each having first and second terminals, the first terminal of the first transistor being coupled to the fourth input of the power supply regulator, the second terminal of the first transistor being coupled to the output of the power supply regulator, the first terminal of the second transistor being coupled to the output of the power supply regulator, and the second terminal of the second transistor being coupled to the second input of the power supply regulator.

23. A method of operating a power supply regulator having an input that receives an input voltage having an input voltage value, and a control signal having a first value and a second value, and an output that provides an output voltage having one of a first output voltage value in response to the control signal being at its first value and a second output voltage value in response to the control signal being at its second value, the second output voltage value being greater than the first output voltage value and the input voltage value, the method comprising a step of:
   A. isolating, in response to the control signal being at its second value, the input of the power supply regulator from transients generated by the power supply regulator when the output voltage switches from the first output voltage value to the second output voltage value.

24. The method of claim 23, wherein the transients are generated by a portion of the power supply regulator, and wherein step A includes a step of isolating the input of the power supply regulator from the portion of the power supply regulator before the output voltage switches from the first output voltage value to the second output voltage value.

25. The method of claim 23, wherein step A includes a step of providing a switch coupled between the input of the power supply regulator and the portion of the power supply regulator.

26. A power supply comprising:
   a voltage source having an output that provides a first reference voltage value;
   an input to receive a control signal having a value;
   an output that provides an output voltage having one of a first output voltage value and a second output voltage value in response to a value of the control signal, the second output voltage value being greater than the first output voltage value and the input voltage value;
   a regulator circuit having a first input, a second input coupled to the input of the power supply and an output coupled to the output of the power supply; and
   a switching circuit having a first input coupled to the output of the voltage source, a second input coupled to the input of the power supply to receive the control signal and an output coupled to the first input of the regulator circuit, the switching circuit electrically isolating the voltage source from transients generated by the regulator circuit when the output of the power supply switches from the second voltage value to the first voltage value.

27. The power supply of claim 26, wherein the regulator circuit further includes:
   an electrical component having an input coupled to the output of the switching circuit and an output, the electrical component providing essentially a short circuit from the input of the electrical component to the output of the electrical component when a voltage at the input of the electrical component is greater than a voltage at the output of the electrical component by a predetermined amount, the electrical component providing essentially an open circuit from the output of the electrical component to the input of the electrical component when a voltage at the input of the electrical component is less than a voltage at the output of the electrical component, and
   a capacitor having a first terminal coupled to the output of the electrical component and a second terminal coupled to the output of the power supply.

28. The power supply of claim 27, wherein the control value alternates between first and second voltage levels corresponding to first and second logic states, and wherein the regulator circuit further includes a drive stage having first and second outputs and an input coupled to the second input of the regulator circuit to receive the control signal, the drive stage being arranged to provide complementary output voltages at the first and second outputs of the drive stage.

29. The power supply of claim 28, wherein the regulator circuit further includes:
   a third input to receive a second reference voltage; and
   first and second buffer amplifiers having inputs respectively coupled to the first and second outputs of the drive stage, and each having an output, the first buffer amplifier having first and second bias inputs respectively coupled to the first and second terminals of the capacitor, the second buffer amplifier having first and second bias inputs respectively coupled to the first and third inputs of the regulator circuit.

30. The power supply of claim 29, wherein the regulator circuit further includes:
   a fourth input to receive a third reference voltage; and
   first and second transistors each having a control input coupled to the output of a respective one of the first and second buffer amplifiers, and each having first and second terminals, the first terminal of the first transistor being coupled to the fourth input, the second terminal of the first transistor being coupled to the output of the power supply, the first terminal of the second transistor being coupled to the output of the power supply, and the second terminal of the second transistor being coupled to the third input of the regulator circuit.

31. The power supply of claim 30, wherein the electrical component is a diode.

32. The power supply of claim 26, wherein the switching circuit is arranged to operate in one of a first and a second operational state in response to the value of the control signal, wherein in the first operational state, the output of the switching circuit is coupled to the first input of the switching circuit so that the voltage at the output of the switching circuit substantially equals the voltage at the input, and in the second operational state, the output of the switching circuit is substantially electrically isolated from the first input of the switching circuit.

33. The power supply of claim 32, wherein the switching circuit is arranged, in response to a change in the value of the control signal, to switch from the first operational state to the second operational state before the output voltage at the output of the power supply switches from the first voltage value to the second voltage value in response to the change in value of the control signal.

34. The power supply of claim 33, wherein the switching circuit includes:

a buffer amplifier having first and second inputs respectively coupled to the first and second inputs of the switching circuit and an output; and an inverter having an input coupled to the output of the buffer amplifier and an output coupled to the output of the switching circuit.

35. The power supply of claim 34, wherein the regulator circuit further includes:

an electrical component having an input coupled to the output of the switching circuit and an output the electrical component providing essentially a short circuit from the input of the electrical component to the output of the electrical component when a voltage at the input of the electrical component is greater than a voltage at the output of the electrical component by a predetermined amount, the electrical component providing essentially an open circuit from the output of the electrical component to the input of the electrical component when a voltage at the input of the electrical component is less than a voltage at the output of the electrical component; and a capacitor having a first terminal coupled to the output of the electrical component and a second terminal coupled to the output of the power supply.

36. The power supply of claim 35, wherein the electrical component is a diode.

37. The power supply of claim 35, wherein the control value alternates between first and second voltage levels corresponding to first and second logic states, and wherein the regulator circuit further includes a drive stage having first and second outputs and an input coupled to the second input of the regulator circuit to receive the control signal, the drive stage being arranged to provide complementary output voltages at the first and second outputs of the drive stage.

38. The power supply of claim 37, wherein the regulator circuit further includes:

a third input to receive a second reference voltage; and first and second buffer amplifiers having inputs respectively coupled to the first and second outputs of the drive stage, and each having an output, the first buffer amplifier having first and second bias inputs respectively coupled to the first and second terminals of the capacitor, the second buffer amplifier having first and second bias inputs respectively coupled to the first and third inputs of the regulator circuit.

39. The power supply of claim 38, wherein the regulator circuit further includes:

a fourth input to receive a third reference voltage; and first and second transistors each having a control input coupled to the output of a respective one of the first and second buffer amplifiers, and each having first and second terminals, the first terminal of the first transistor being coupled to the fourth input, the second terminal of the first transistor being coupled to the output of the power supply, the first terminal of the second transistor being coupled to the output of the power supply, and the second terminal of the second transistor being coupled to the third input of the regulator circuit.

40. In a power supply regulator having an input that receives an input voltage having an input voltage value and an output that provides an output voltage having one of a first output voltage value and a second output voltage value in response to a value of a control signal, the second output voltage value being greater than the first output voltage value and the input voltage value, an isolation circuit comprising:

a first input coupled to the input of the power supply regulator to receive the input voltage;

a second input to receive the control signal; and isolation means, coupled to the first and second inputs of the isolation circuit, for electrically isolating the input of the power supply regulator from transient signals generated by the power supply regulator when the output voltage switches from the first output voltage value to the second output voltage value.

41. The isolation circuit of claim 40, wherein the isolation means includes:

a switch having an input and an output respectively coupled to the input and the output of the power supply regulator, the switch having a first operational state in which the input of the switch is electrically coupled to the output of the switch and a second operational state in which the input of the switch is substantially electrically isolated from the output of the switch.

42. The isolation circuit of claim 41, wherein the isolation means includes:

detecting means, coupled to the second input of the isolation circuit, for detecting a change in the value of the control signal; and control means, coupled to the switch and the detecting means, for causing the switch to switch between the first operational state and the second operational state in response to the change in the value of the control signal.

* * * * *